(12) United States Patent
Healy et al.

(10) Patent No.: US 9,313,881 B2
(45) Date of Patent: Apr. 12, 2016

(54) THROUGH MOLD VIA RELIEF GUTTER ON MOLDED LASER PACKAGE (MLP) PACKAGES

(71) Applicant: Qualcomm Incorporated, San Diego, CA (US)

(72) Inventors: Christopher J. Healy, San Diego, CA (US); Gopal C. Jha, San Diego, CA (US); Manuel Aldrete, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 399 days.

(21) Appl. No.: 13/777,298

(22) Filed: Feb. 26, 2013

(65) Prior Publication Data

US 2014/0196940 A1    Jul. 17, 2014

Related U.S. Application Data

(60) Provisional application No. 61/751,313, filed on Jan. 11, 2013.

(51) Int. Cl.
*H05K 1/11* (2006.01)
*H05K 1/02* (2006.01)
(Continued)

(52) U.S. Cl.
CPC .......... *H05K 1/0271* (2013.01); *H01L 23/3157* (2013.01); *H01L 23/49816* (2013.01);
(Continued)

(58) Field of Classification Search
CPC ............. H01K 1/02; H01K 1/11; H05K 3/10; H05K 3/24; H05K 3/28; H05K 3/34; H05K 3/46; H01L 23/04; H01L 23/31; H01L 23/48; H01L 23/49; H01L 23/52

USPC .......... 174/263, 257, 260, 261, 266; 361/764; 257/734, 752, 773, 774, E21.001, 257/E21.5, E23.011; 29/852
See application file for complete search history.

(56) References Cited

U.S. PATENT DOCUMENTS 4,706,167 A * 11/1987 Sullivan ............... H05K 1/0266
174/257
4,996,391 A * 2/1991 Schmidt ................. H05K 1/116
174/255
(Continued)

FOREIGN PATENT DOCUMENTS

WO     2010100706 A1     9/2010

OTHER PUBLICATIONS

International Search Report and Written Opinion—PCT/US2014/011230—ISA/EPO—May 20, 2014.

*Primary Examiner* — Xiaoliang Chen
(74) *Attorney, Agent, or Firm* — Michelle S. Gallardo

(57) ABSTRACT

Improved Molded Laser Package (MLP) Packages which include a relief path for pressure and reduces the risk of shorting adjacent solder balls are provided. The MLP packages may include a gutter integrally connected to one or more through mold vias allowing a path to relieve pressure created when moisture gets entrapped in through mold vias, during the manufacturing process, while also reducing the risk of solder shorts between adjacent solder balls located in the through mold vias. Additionally, MLP packages which include gutters integrally connected to one or more through mold vias may enable tighter bump pitch and thinner packages. As a result, process margins and risks associated with surface mount technology (SMT) may be improved and provide more flexibility on inventory staging.

32 Claims, 7 Drawing Sheets

(51) Int. Cl.
   *H05K 3/40*      (2006.01)
   *H01L 23/31*     (2006.01)
   *H01L 23/498*    (2006.01)
   *H01L 23/00*     (2006.01)
   *H01L 21/56*     (2006.01)

(52) U.S. Cl.
   CPC .............. *H01L24/13* (2013.01); *H05K 3/4038* (2013.01); *H01L 21/56* (2013.01); *H01L 24/16* (2013.01); *H01L 24/81* (2013.01); *H01L 2224/10145* (2013.01); *H01L 2224/1191* (2013.01); *H01L 2224/131* (2013.01); *H01L 2224/13021* (2013.01); *H01L 2224/13022* (2013.01); *H01L 2224/81193* (2013.01); *H01L 2224/81815* (2013.01); *H01L 2924/12042* (2013.01); *H01L 2924/3841* (2013.01); *H05K 2201/0305* (2013.01); *Y10T 29/49165* (2015.01)

(56) References Cited

U.S. PATENT DOCUMENTS

| | | | | |
|---|---|---|---|---|
| 5,404,044 A * | 4/1995 | Booth | ............... | H01L 23/49827 257/686 |
| 5,784,782 A | 7/1998 | Boyko et al. | | |
| 6,562,656 B1 * | 5/2003 | Ho | ...................... | H01L 21/4853 257/E21.5 |
| 6,573,598 B2 * | 6/2003 | Ohuchi | ................... | H01L 21/78 257/734 |
| 6,787,443 B1 * | 9/2004 | Boggs | .................... | H05K 1/116 29/852 |
| 8,222,538 B1 * | 7/2012 | Yoshida | ............... | H01L 23/3128 174/260 |
| 2002/0003160 A1 * | 1/2002 | Beroz | ............... | H01L 23/49816 228/180.1 |
| 2002/0093089 A1 | 7/2002 | Lu et al. | | |
| 2002/0167085 A1 * | 11/2002 | Ohuchi | ................... | H01L 21/78 257/750 |
| 2003/0201309 A1 * | 10/2003 | Grigg | ..................... | B23K 1/203 228/207 |
| 2003/0214795 A1 * | 11/2003 | Sakuyama | ............... | H01L 24/11 361/767 |
| 2005/0184371 A1 * | 8/2005 | Yang | ................. | H01L 23/49816 257/678 |
| 2009/0071707 A1 * | 3/2009 | Endo | ........................ | C25D 5/02 174/266 |
| 2009/0283900 A1 * | 11/2009 | Yamada | ................ | H01L 21/565 257/698 |
| 2011/0156264 A1 * | 6/2011 | Machida | ............. | H01L 21/4846 257/773 |
| 2011/0189848 A1 * | 8/2011 | Ewert | ....................... | C25D 3/32 438/612 |
| 2011/0272819 A1 * | 11/2011 | Park | ........................ | H01L 24/05 257/774 |
| 2011/0285008 A1 * | 11/2011 | Nakano | ................... | H01L 24/03 257/692 |
| 2011/0309505 A1 * | 12/2011 | Takemura | ............... | H01L 22/32 257/738 |
| 2012/0153499 A1 | 6/2012 | Byun et al. | | |

\* cited by examiner

THROUGH MOLD VIA RELIEF GUTTER ON MOLDED LASER PACKAGE (MLP) PACKAGES

The present application claims priority to U.S. Provisional Application No. 61/751,313 entitled "Through Mold Via Relief Gutter on Molded Laser Package (MLP) Packages", filed Jan. 11, 2013, which is hereby expressly incorporated by reference herein.

BACKGROUND

1. Field

Various features relate to gutters integrally connected to through mold vias in Molded Laser Package (MLP) Packages for pressure relief for preventing solder shorts.

2. Background

Solder shorts are becoming more common when using a surface mount technology (SMT) process on molded laser package (MLP) packages. Tightened top ball pitch and thinner packages used in the manufacturing process contribute to the increase in solder shorts. Furthermore, through mold via limitations in manufacturing and the presence of moisture in packages leads to solder shorts due to insufficient through mold via volume and the creation of high pressure in the through mold vias. That is, the moisture gets entrapped in the through mold vias resulting in a solder short.

FIG. 1 illustrates a cross sectional view of a pair of solder balls 102 disposed on a pair of electrical contact pads 104 within a substrate 106. A molding layer 108 is located on top of the substrate 106 and a pair of through mold vias 110 extends through the molding layer 108 to the pair of electrical contact pads 104 within the substrate 106. As shown in FIG. 1, the molding layer 108 does not have any relief paths, such as openings, gutters, channels, etc., to relieve the pressure that builds up during the manufacturing process. The buildup of pressure from insufficient through mold via volume causes one or more of the solder balls 102 to expand and flow over a wall 109 in the molding layer, which separates the solder balls 102, causing a short.

FIG. 2 illustrates an example of a solder short 202. A first solder ball 204 comes into contact with a second solder ball 206 resulting in the short 202. As shown, the short is formed when the second solder ball 206, located in a through mold via 208, melts and comes into contact with the first solder ball 204. As described above, the short may be a result of insufficient through mold via volume creating high pressure in the through mold vias and trapping moisture.

Therefore, there is a need for improved Molded Laser Package (MLP) Packages which include a relief path for pressure and reduces the risk of shorting adjacent solder balls.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

A first example provides an apparatus, such as a Molded Laser Package (MLP) Package, having gutters for pressure relief for preventing solder shorts. The apparatus may include a substrate having a plurality of electrical contact pads, a molding layer located parallel to the substrate and a plurality of solder balls that are located on the plurality of electrical contact pads and exposed by a plurality of through mold vias arranged in multiple rows and formed in the molding layer. Each of the solder balls may have a vertical diameter and a horizontal diameter and be co-planar with the top surface of the molding layer.

A plurality of gutters may be located on an outer portion of, and adjacent to, at least some of the plurality of through mold vias, where each gutter in the plurality of gutters extends vertically from the top surface of the molding layer to a depth equal to or less than half the vertical diameter of a corresponding solder ball. A portion of the molding layer may be removed to create each of the gutters in the plurality of gutters. In some implementations, the removed portion may be large enough to accommodate approximately 50% of the corresponding solder ball when melting or approximately 40%-50% of the corresponding solder ball when melting.

The multiple rows in the plurality of through mold vias may include an outer row of through mold vias extending around a perimeter of the apparatus and an inner row of through mold vias adjacent to the outer row of through mold vias and extending around the perimeter of the apparatus. Each of the through mold vias in the outer row of through mold vias may have a first outer side facing the perimeter of the apparatus and a first inner side facing a center of the apparatus. Additionally, each of the through mold vias in the inner row of through mold vias may have a second outer side facing the center of the apparatus and a second inner side facing the perimeter of the apparatus.

According to one aspect, each of the gutters may be separate from each other and have a horizontal length that is approximately the length of the horizontal diameter of the corresponding solder ball.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus, such as a Molded Laser Package (MLP) Package, having gutters with tiered depths for pressure relief for preventing solder shorts. The apparatus may include a substrate having a plurality of electrical contact pads, a molding layer located parallel to the substrate and a plurality of solder balls that are located on the plurality of electrical contact pads and exposed by a plurality of through mold vias arranged in multiple rows and formed in the molding layer. Each of the solder balls may have a vertical diameter and a horizontal diameter and be co-planar with the top surface of the molding layer.

A plurality of gutters may be located on an outer portion of, and adjacent to, at least some of the plurality of through mold vias, where at least some of the gutters in the plurality of gutters have a first tier extending from the top surface of the molding layer to a first depth and a second tier extending from the top surface of the molding layer to a second depth, where the first depth and the second depth are different. A portion of the molding layer may be removed to create each of the gutters in the plurality of gutters. In some implementations, the removed portion may be large enough to accommodate approximately 50% of the corresponding solder ball when melting or approximately 40%-50% of the corresponding solder ball when melting.

According to one aspect, the first and second depths may be equal to or less than half the vertical diameter of a corresponding solder ball to provide a pressure relief path for the corresponding solder ball when melting.

According to one aspect, the first depth is equal to or less than half the vertical diameter of a corresponding solder ball and the second depth is equal to or greater than the vertical diameter of the corresponding solder ball to provide a pressure relief path for the corresponding solder ball when melting.

The multiple rows in the plurality of through mold vias may include an outer row of through mold vias extending around a perimeter of the apparatus and an inner row of through mold vias adjacent to the outer row of through mold vias and extending around the perimeter of the apparatus. Each of the through mold vias in the outer row of through mold vias may have a first outer side facing the perimeter of the apparatus and a first inner side facing a center of the apparatus. Additionally, each of the through mold vias in the inner row of through mold vias may have a second outer side facing the center of the apparatus and a second inner side facing the perimeter of the apparatus.

According to one aspect, each of the gutters may be separate from each other and have a horizontal length that is approximately the length of the horizontal diameter of the corresponding solder ball.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides an apparatus, such as a Molded Laser Package (MLP) Package having at least some gutters with tiered depths for pressure relief for preventing solder shorts. The apparatus may include a substrate having a plurality of electrical contact pads, a molding layer, having a top surface and a bottom surface, that extends across the substrate and a plurality of solder balls that are located on the plurality of electrical contact pads and exposed by a plurality of through mold vias arranged in multiple rows and formed in the molding layer.

According to one aspect, each of the solder balls may have a vertical diameter and a horizontal diameter and be co-planar with the top surface of the molding layer. A plurality of gutters may be located on an outer portion of, and adjacent to, at least some of the plurality of through mold vias, where at least some of the gutters in the plurality of gutters extend vertically from the top surface of the molding layer to a depth equal to or less than half the vertical diameter of a corresponding solder ball and where at least some of the gutters in the plurality of gutters have a first tier extending vertically from the top surface of the molding layer to a first depth and a second tier extending vertically from the top surface of the molding layer to a second depth, where the first depth and the second depth are different.

According to one aspect, the first and second depths are equal to or less than half the vertical diameter of a second corresponding solder ball to provide a pressure relief path for the second corresponding solder ball when melting.

According to one aspect, the first depth is equal to or less than half the vertical diameter of a second corresponding solder ball and the second depth is equal to or greater than the vertical diameter of the second corresponding solder ball to provide a pressure relief path for the corresponding solder ball when melting. A portion of the molding layer may be removed to create each of the gutters in the plurality of gutters. In some implementations, the removed portion may be large enough to accommodate approximately 50% of the corresponding solder ball when melting or approximately 40%-50% of the corresponding solder ball when melting.

The multiple rows in the plurality of through mold vias may include an outer row of through mold vias extending around a perimeter of the apparatus and an inner row of through mold vias adjacent to the outer row of through mold vias and extending around the perimeter of the apparatus. Each of the through mold vias in the outer row of through mold vias may have a first outer side facing the perimeter of the apparatus and a first inner side facing a center of the apparatus. Additionally, each of the through mold vias in the inner row of through mold vias may have a second outer side facing the center of the apparatus and a second inner side facing the perimeter of the apparatus.

According to one aspect, each of the gutters may be separate from each other and have a horizontal length that is approximately the length of the horizontal diameter of the corresponding solder ball.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

In a fourth example a method for manufacturing a Molded Laser Package (MLP) Package is provided. The method provides a substrate, one or more electrical contact pads in the substrate and one or more solder balls on top of the one or more electrical contact pads. The one or more solder balls include a vertical diameter and a horizontal diameter. The method further provides a molding layer on a top surface of the substrate covering the substrate and placement of the one or more solder balls on the one or more electrical contact pads.

According to one aspect, one or more through mold vias are formed by selectively removing portions of the molding layer over the one or more solder balls to expose a portion of the one or more solder balls.

According to one aspect, gutters are formed by selectively removing portions of the molding layer on an outer portion of, and adjacent to at least some of the one or more through mold vias, where each portion removed extends vertically from a top surface of the molding layer to a depth equal to or less than half the vertical diameter of a corresponding solder ball. Each removed portion of the molding layer may be separate from each other, have a length approximately the length of the horizontal diameter of the corresponding solder ball and provide a pressure relief path for the corresponding solder ball when melting.

According to one aspect, a second substrate having one or more second electrical contacts pads is formed. The second substrate is electrically coupled to the molding layer such that the one or more second electrical contact pads aligned with and contacting the one or more solder balls.

According to one aspect, the MLP package is incorporated within a semiconductor die which is integrated into at least one of a music player, a video player, an entertainment unit, a navigation device, a communications device, a mobile device, a mobile phone, a smartphone, a personal digital assistant, a fixed location terminal, a tablet computer, and/or a laptop computer.

In a fifth example an apparatus includes means for providing a substrate, means for providing one or more electrical contact pads in the substrate and means for providing one or more solder balls on top of the one or more electrical contact pads, the one or more solder balls having a vertical diameter and a horizontal diameter.

The apparatus further includes means for providing a molding layer on a top surface of the substrate covering the substrate and the one or more solder balls placed on the one or more electrical contact pads, means for forming one or more through mold vias by selectively removing portions of the molding layer over the one or more solder balls to expose a portion of the one or more solder balls; and means for forming gutters by selectively removing portions of the molding layer on an outer portion of, and adjacent to at least some of the one or more through mold vias, where each portion removed extends vertically from a top surface of the molding layer to a depth equal to or less than half the vertical diameter of a corresponding solder ball.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

These and other aspects of the disclosure will become more fully understood upon a review of the detailed description, which follows.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may be shown in detail in order not to obscure the embodiments.

The word "exemplary" is used herein to mean "serving as an example, instance, or illustration." Any implementation or embodiment described herein as "exemplary" is not necessarily to be construed as preferred or advantageous over other embodiments. Likewise, the term "embodiments" does not require that all embodiments include the discussed feature, advantage or mode of operation.

Overview

Improved Molded Laser Package (MLP) Packages which include a relief path for pressure and reduce the risk of shorting adjacent solder balls are provided. The MLP packages may include one or more gutters integrally connected to one or more through mold vias. The one or more gutters provide a path to relieve pressure created when moisture gets entrapped in the through mold vias, during the manufacturing process, while also reducing the risk of solder shorts between adjacent solder balls located on electrical pads and exposed by the through mold vias formed in a molding layer (or compound). Additionally, MLP packages which include one or more gutters integrally connected to one or more through mold vias may enable tighter bump pitch and thinner packages. As a result, process margins and risks associated with surface mount technology (SMT) may be improved and provide more flexibility on inventory staging.

Exemplary Molded Laser Package (MLP) Package

Figure 1:
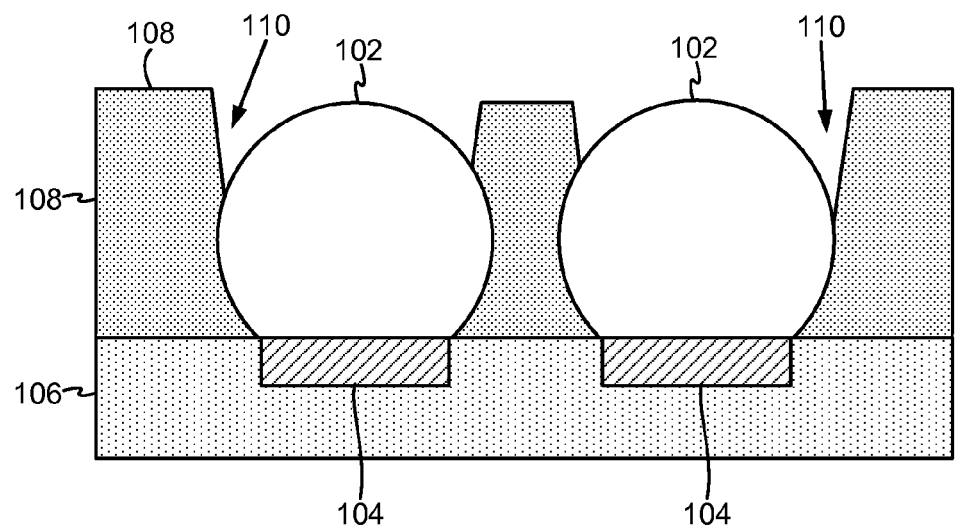
FIG. 1 illustrates a cross sectional view of a pair of solder balls disposed on a pair of electrical contact pads within a substrate.
Figure 2:
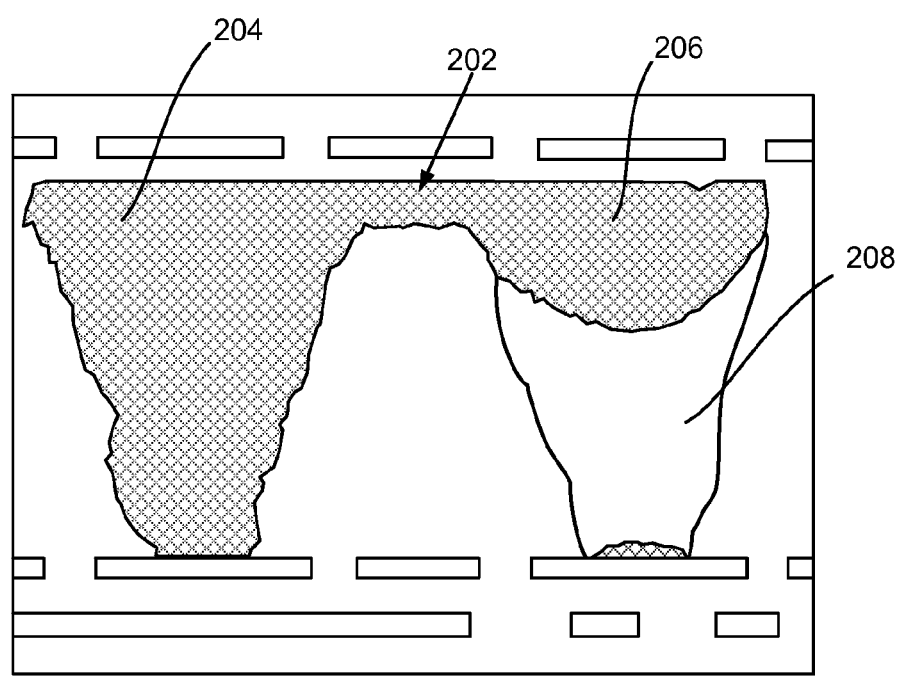
FIG. 2 illustrates an example of solder short.
Figures 3, 4:
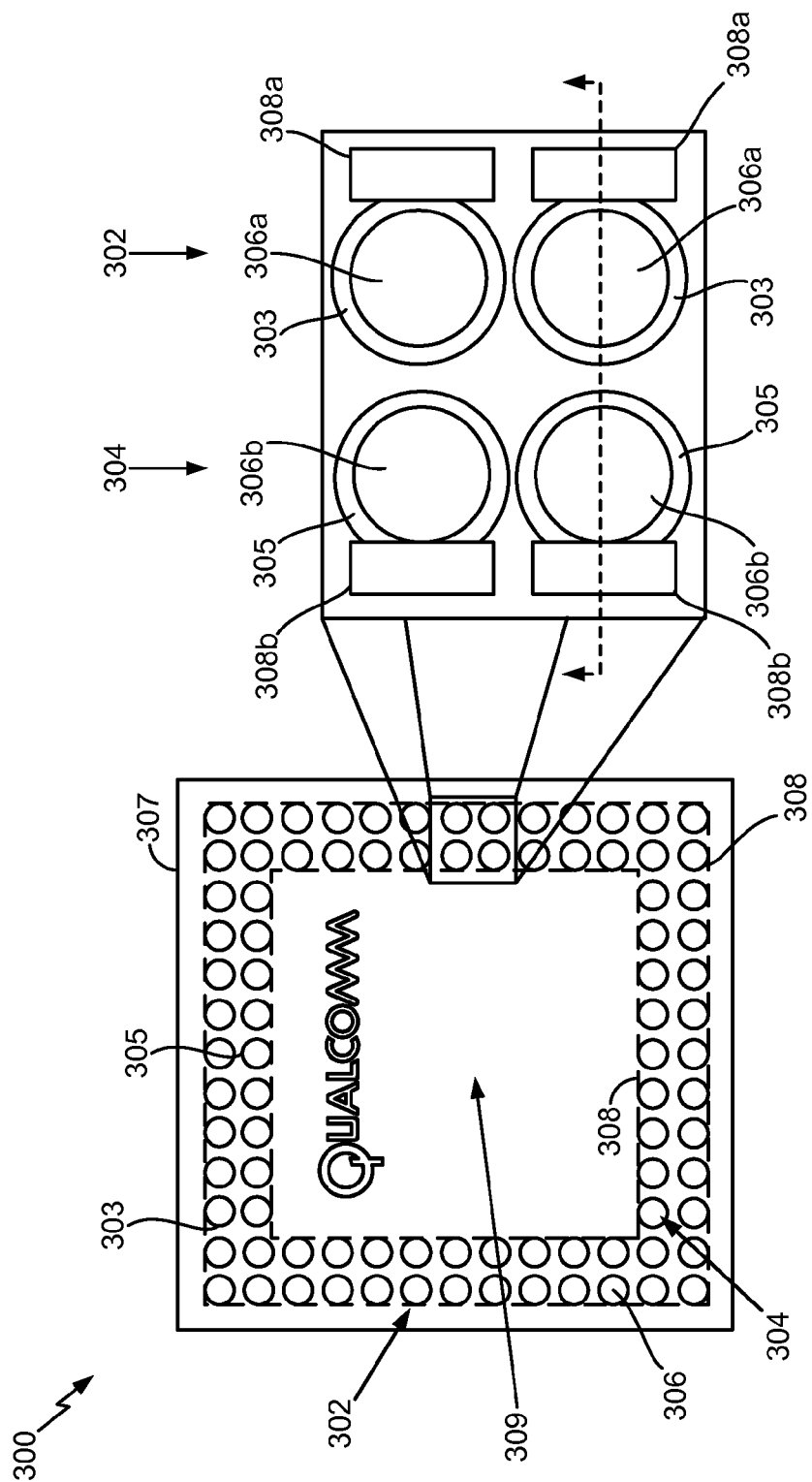
FIG. 3 illustrates an example of a top plan view of a Molded Laser Package (MLP) package, according to one example.
FIG. 4 illustrates an enlarged top plan view of detail A of FIG. 3

FIG. 3 illustrates an example of a MLP package 300, according to one example. As shown, the MLP package 300 comprises an outer row of through mold vias 303 extending around the perimeter of the package 300 and an inner row 304 of through mold vias 305 adjacent to the outer row 302 of through mold vias 303. Both the outer and inner rows 302, 304 of through mold vias 303, 305, respectively, extend around the outer surface of the package 300 where the outer row 302 may be located closest to the outer perimeter 307 of the package 300. Solder balls 306 may be located on electrical pads and exposed by the through mold vias 303, 305 formed in the molding layer. That is, a mold may be provided on, and surround, the solder balls and then selectively removed forming a through mold via. The solder balls may have a circular or elliptical shape, for example, having a vertical diameter and a horizontal diameter.

Each through through mold via in the outer row 302 may have an outer side facing the outer perimeter 307 of the package 300 and an inner side facing a center portion 309 of the package 300 while each through mold via in the inner row 304 may have an outer side facing the center portion 309 of the package 300 and an inner portion facing the outer perimeter 307 of the package 300. Although two rows are shown, this is by way of example only and the MLP package 300 may include a single row or more than two rows.

A plurality of gutters 308 may be integrally connected and located adjacent to the through mold vias 303, 305 allowing a path for pressure relief while reducing the risk for shorting to adjacent solder balls. Each of the gutters 308 may be extend from a top surface 320a of a molding layer 320 (See FIG. 5) vertically to a depth (D), where D may be, for example, equal to or less than half of the vertical diameter of a solder ball (i.e. the midpoint of the solder ball) located in a corresponding through mold via, approximately a quarter of the vertical diameter of the solder ball or approximately a third of the vertical diameter of the solder ball. Each of the gutters 308 may be formed by removing portions of the molding layer 320 which allows for expansion of solder in the solder balls to prevent solder bridging. Additionally, removing a portion of the molding layer 320 to create a gutter may allow for a tighter pitch of the through mold vias compared to through mold vias without an adjacent gutter as the holes that form the through mold vias may be smaller. The tighter pitch of the through mold vias result from the solder balls being placed closer together without the concern of solder shorts. Alternatively, to avoid shorts, the solder balls would be placed further apart which increases the pitch. Although gutters 308a and 308b are shown having the same depth (D), this is by way of example only and the depth (D) of each gutter may be different.

According to one embodiment, the space, area or portion removed from the molding layer 320 to create or form the gutter may be large enough to accommodate approximately 50% of a solder ball, approximately 40% of the solder ball, approximately 30% of the solder ball, approximately 25% of the solder ball or approximately 10% of the solder ball. Alternatively, each gutter may have a space, area or portion large enough to accommodate approximately 50%-60% of the solder ball, approximately 40%-50% of the solder ball, approximately 30%-40% of the solder ball, approximately 25%-30% of the solder ball or approximately 25%-60% of the solder ball.

FIG. 4 illustrates an enlarged top plan view of detail A of FIG. 3. Detail A illustrates a close up view of a pair of solder balls 306a, located on electrical pads (not shown), and exposed by a via formed in a molding layer, within the outer row 302 of through mold vias 303 and a pair of solder balls 306b, located on electrical pads (not shown), and exposed by a via formed in the molding layer, within the inner row 304 of through mold vias 305. As shown, the gutters 308a, 308b may be integrally connected and adjacent to the through mold vias 303, 305. According to one embodiment, the gutters 308a, 308b may have a horizontal length (L) which may be approximately the same length as the horizontal diameter of the solder balls 306a, 306b and may be separate, i.e. not one continuous gutter. Alternatively, the length (L) of the gutters 308a, 308b may be less than the horizontal diameter of the solder balls 306a, 306b or the length (L) of the gutters 308a, 308b may be greater than the horizontal diameter of the solder balls 306a, 306b. Additionally, the length (L) of each gutter may vary and all gutters may not be uniform in length.

According to one embodiment, the gutters 308a may be connected forming a continuous gutter in the molding layer on the outside peripheral of the substrate. Additionally, the gutters 308b may be connected forming a continuous gutter in the molding layer on the inside peripheral of the substrate.

According to one embodiment, each of the gutters 308a located in the outer row 302 of through mold vias 303 may be adjacent or integrally connected to the outer side of the through mold vias 303 facing the outer perimeter 307 of the package 300 while each of the gutters 308b located in the inner row 304 of through mold via 305 may be adjacent or integrally connected to the outer side of the through mold via 305 facing a center portion 309 of the package 300.

According to one embodiment, each of the through mold vias 303, 305 in the first and second rows 302, 304 may be integrally connected to one or more gutters 308. Alternatively, not every through mold via on the package may be integrally connected to a gutter 308. Although the gutters 308 are shown as rectangular, this is by way of example only and the gutter may be any shape.

Figure 5:
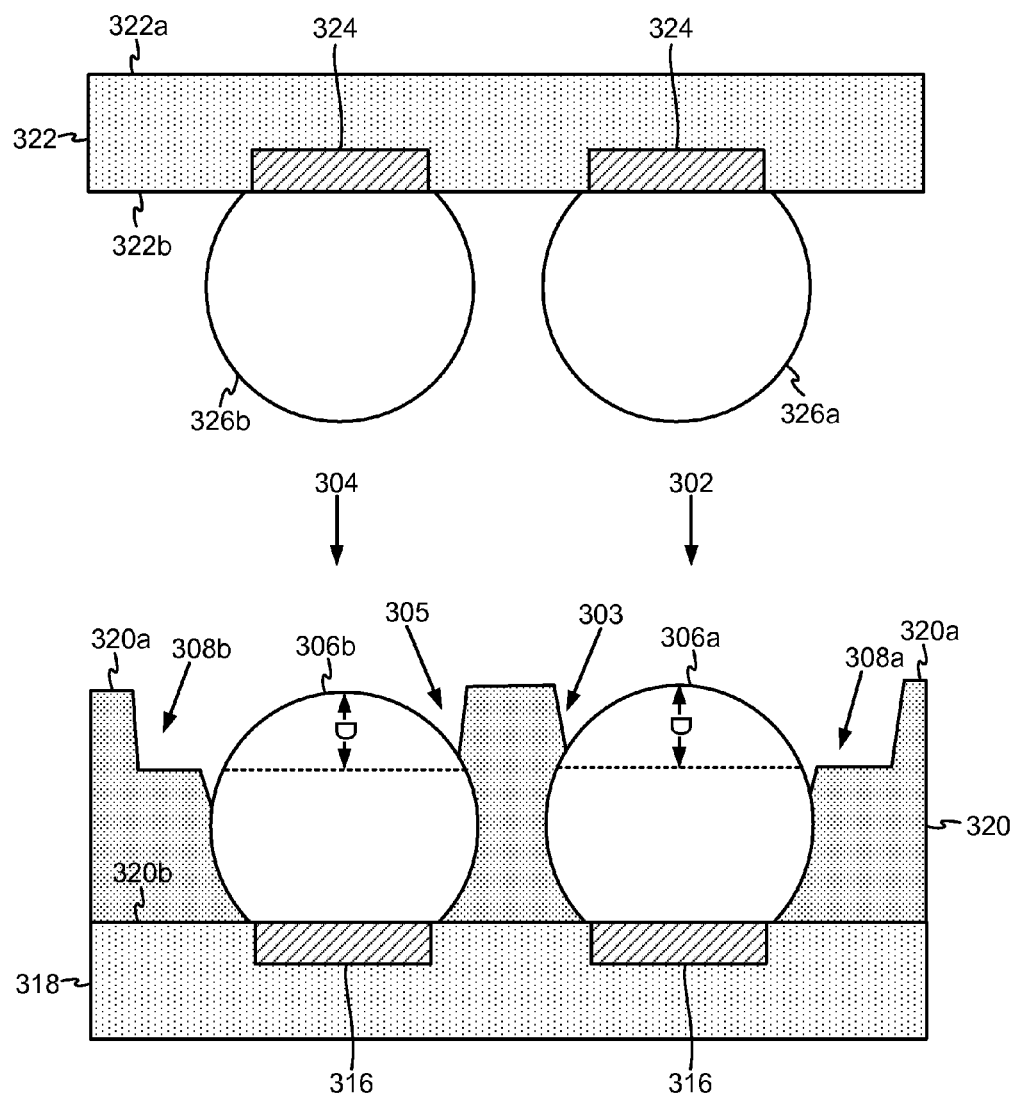
FIG. 5 is a cross-sectional view of detail A taken along line 4-4 of FIG. 4.

FIG. 5 is a cross-sectional view of detail A taken along line 4-4 of FIG. 4. As shown, the solder balls 306a, 306b may be disposed on a pair of electrical contact pads 316 within a substrate 318. The molding layer 320 may be provided on and surround the solder balls 306a, 306b and have a top surface 320a substantially co-planar with the top of the solder balls and a bottom surface 320b which extends across the substrate 318. The molding layer 320 may be selectively removed forming the through mold vias 303, 305.

As described above, the plurality of gutters 308 may be located within the molding layer 320 allowing a path for pressure relief while reducing the risk for shorting to adjacent solder balls. As shown, a first gutter 308a may be integrally connected, and located adjacent to the first through mold via 303 and a second gutter 308b may be integrally connected to, and located adjacent to, the second through mold via 305.

According to one embodiment, each of the plurality of gutters 308 in the outer row 302 of through mold vias 303 may be located on the outer side of the through mold vias and each of the plurality of gutters in the inner row 304 of through mold vias 305 may be located on the inner side of the through mold vias.

As shown, a second substrate 322 may be formed on top of the molding layer 320. The second substrate 322 may have a top surface 322a and a bottom surface where a pair of electrical contact pads 324 are located within the second substrate 322 near or aligned with the bottom surface of the second substrate 324. A top pair of solder balls 326a, 326b may be disposed on the pair of electrical contact pads 324 within a substrate 322. The top pair of solder balls 326a, 326b may attach to the the solder balls 306a, 306b disposed on the pair of electrical contact pads 316 within the substrate 318 and reflowed to form an electrical connection.

Exemplary Tiered Gutter

Figure 6:
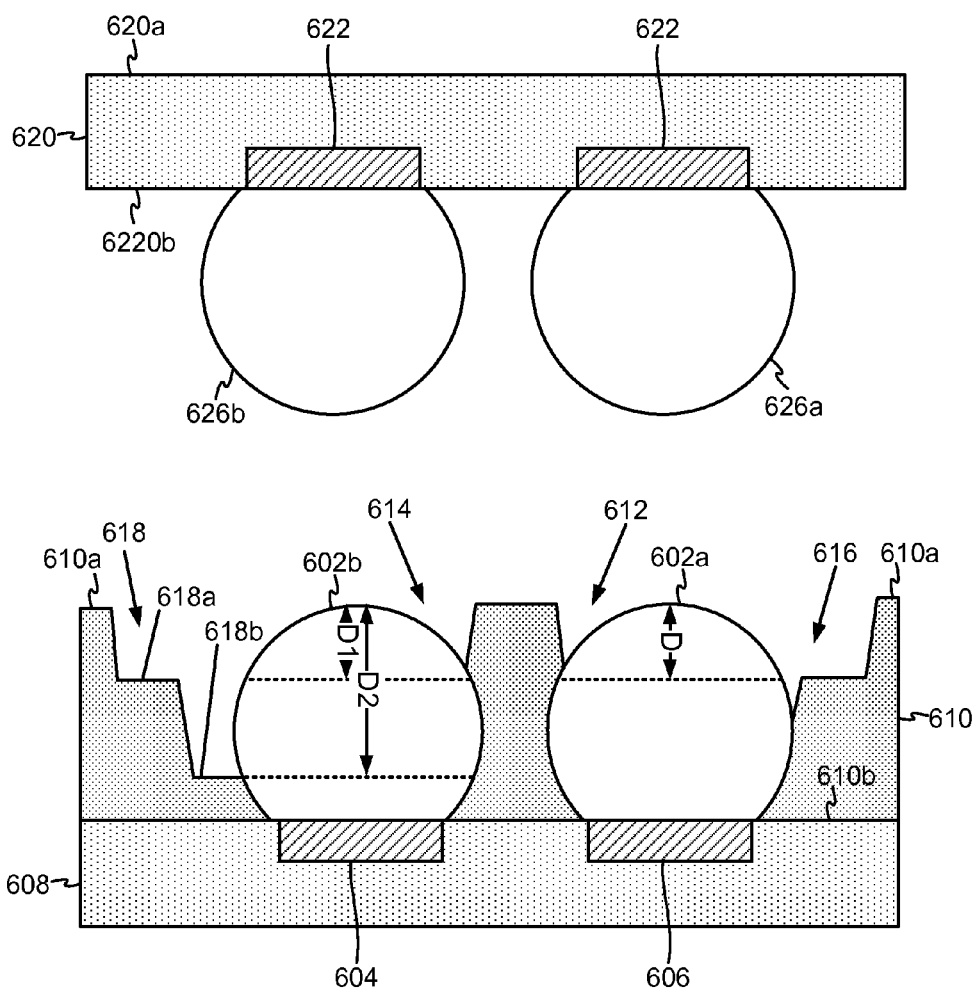
FIG. 6 illustrates a cross sectional view of a pair of solder balls disposed on a pair of electrical contact pads within a substrate.

FIG. 6 illustrates a cross sectional view of a pair of solder balls 602a, 602b disposed on a first electrical contact pads 604 and a second electrical contact pad 606, respectively, within a substrate 608. A molding layer 610 may be provided on and surround the solder balls 602a, 602b and have a top surface 610a substantially co-planar with the top of the solder balls 602a, 602b and a bottom surface 610b extending across the substrate 608. The molding layer 620 may be selectively removed forming a first through mold via 612 and a second through mold via 614.

A plurality of gutters may be located within the molding layer 610 allowing a path for pressure relief while reducing the risk for shorting to adjacent solder balls by allowing for expansion of the solder and for preventing any solder from bridging. As shown, a first gutter 616 may be integrally connected and located adjacent to the first through mold via 612 and a second gutter 618 may be integrally connected and located adjacent to the second through mold via 614.

The first gutter 616 may extend vertically from the top surface 610a of the molding layer 610 to a depth (D), where D may be, for example, approximately a quarter of the vertical diameter of the solder ball 602a, approximately a third of the vertical diameter of the solder ball 602a, or approximately half the vertical diameter of the solder ball 602a (i.e. the midpoint of the solder ball 602a).

According to one embodiment, the space, area or portion removed from the molding layer 610 to create or form the first gutter 616 may be large enough to accommodate approximately 50% of a solder ball 602a, approximately 40% of the solder ball 602a, approximately 30% of the solder ball 602a, approximately 25% of the solder ball 602a, or approximately 10% of the solder ball 602a. Alternatively, each gutter may have a space, area or portion large enough to accommodate approximately 50%-60% of the solder ball 602a, approximately 40%-50% of the solder ball 602a, approximately 30%-40% of the solder ball 602a, approximately 25%-30% of the solder ball 602a, or approximately 25%-60% of the solder ball 602a. Additionally, removing a portion of the molding layer 610 to create a gutter may allow for a tighter pitch of the through mold vias compared to through mold vias without an adjacent gutter as the holes that form the through mold vias may be smaller.

According to one embodiment, the second gutter 618 may have a tiered structure where a first tier may extend vertically from a top surface 610a of the molding layer 610 to a first depth (D1) and a second tier may extend vertically from the top surface 610a of the molding layer 610 to a second depth (D2). The first depth (D1) may be different than the second depth and the second depth (D2) maybe greater than the first depth (D1). According to one embodiment, the first depth (D1) and second depth (D2) may be a combination of, for example, approximately a quarter of the vertical diameter of the solder ball 602b, approximately a third of the vertical diameter of the solder ball 602b, and approximately half the vertical diameter of the solder ball 602b. For example, the first tier 618a may extend vertically to the first depth (D1) and the second tier 618b may extend vertically the second depth (D2), where D2>D1.

According to one embodiment, the first and second depths may be equal to or less than half the vertical diameter the solder ball 602b. Alternatively, the first depth may be equal to or less than half the vertical diameter of a corresponding solder ball and the second depth may be equal to or greater than the vertical diameter of the corresponding solder ball to provide a pressure relief path for the corresponding solder ball when melting.

According to one embodiment, the space, area or portion removed from the molding layer 610 to create or form the first tier 618a of the second gutter 618 may be large enough to accommodate approximately 50% of a solder ball 602b, approximately 40% of the solder ball 602a, approximately 30% of the solder ball 602b, approximately 25% of the solder ball 602a, or approximately 10% of the solder ball 602b. Alternatively, the first tier 618a of the second gutter 618 may have a space, area or portion large enough to accommodate approximately 50%-60% of the solder ball 602b, approximately 40%-50% of the solder ball 602b, approximately 30%-40% of the solder ball 602b, approximately 25%-30% of the solder ball 602a, or approximately 25%-60% of the solder ball 602b.

According to one embodiment, the space, area or portion removed from the molding layer 610 to create or form the second tier 618b of the second gutter 618 may be large enough to accommodate approximately 50% of a solder ball 602b, approximately 40% of the solder ball 602a, approximately 30% of the solder ball 602b, approximately 25% of the solder ball 602a, or approximately 10% of the solder ball 602b. Alternatively, the second tier 618b of the second gutter 618 may have a space, area or portion large enough to accommodate approximately 50%-60% of the solder ball 602b, approximately 40%-50% of the solder ball 602b, approximately 30%-40% of the solder ball 602b, approximately 25%-30% of the solder ball 602a, or approximately 25%-60% of the solder ball 602b. According to one embodiment, the space created by the second tier 618b may be equal to or greater than the space created by the first tier 618a.

As shown, a second substrate 620 may be formed on top of the molding layer 610. The second substrate 620 may have a top surface 620a and a bottom surface where a pair of electrical contact pads 622 are located within the second substrate 620 near or aligned with the bottom surface of the second substrate 620. A top pair of solder balls 626a, 626b may be disposed on the pair of electrical contact pads 622 within a substrate 620. The top pair of solder balls 626a, 626b may attach to the the solder balls 602a, 602b disposed on the pair of electrical contact pads 604 within the substrate 608 and reflowed to form an electrical connection.

Exemplary Flow Diagram for a Manufacturing a MLP with Gutters

Figure 7:
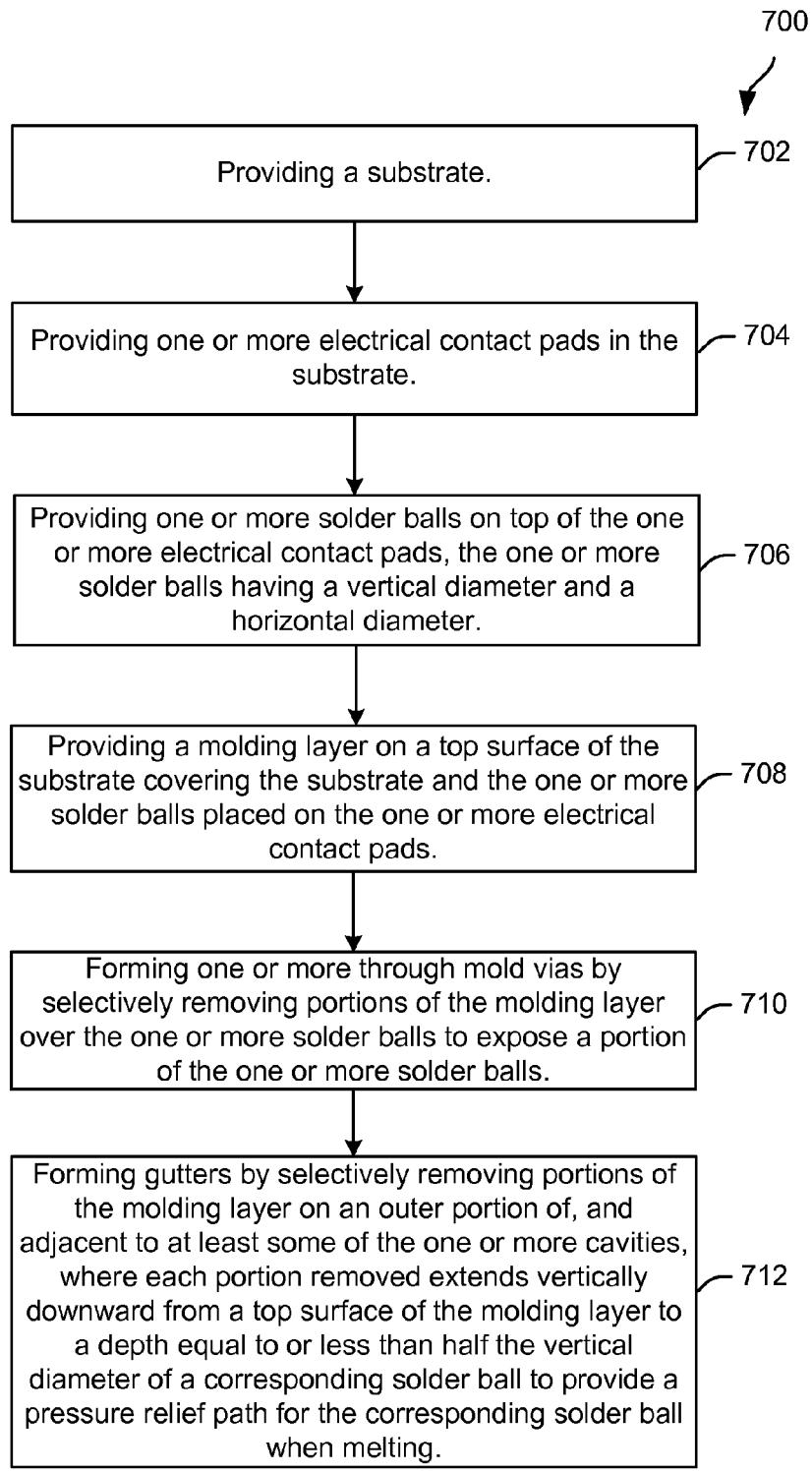
FIG. 7 illustrates a flow diagram for manufacturing a Molded Laser Package (MLP) Package with gutters for pressure relief for preventing solder shorts, according to one example.

FIG. 7 illustrates a flow diagram for a method 700 for manufacturing a Molded Laser Package (MLP) Package with gutters for pressure relief for preventing solder shorts, according to one example. In manufacturing the MLP Package, the process may start by providing a substrate 702 and then providing one or more electrical contact pads in the substrates 704. The substrate may have a top surface and a bottom surface where the one or more electrical contact pads are provided near the top surface. Next, solder balls, having a vertical diameter and a horizontal diameter, may be provided on top of the one or more electrical contact pads 706. A molding layer may then be formed on the top surface of the substrate covering the substrate and the one or more solder balls on top of the one or more electrical contact pads 708.

Next, one or more through mold vias may be formed by selectively removing portions of the molding layer over the one or more solder balls to expose a portion of the one or more solder balls 710. Each portion removed may extend vertically from a top surface of the molding layer to a depth equal to or less than half the vertical diameter of a corresponding solder ball to provide a pressure relief path for the corresponding solder ball when melting 712.

Exemplary Electronic Devices

Figure 8:
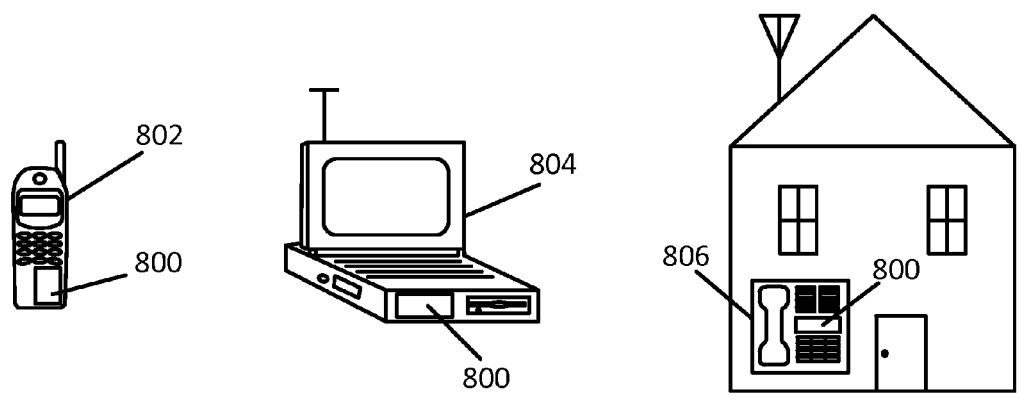
FIG. 8 illustrates various electronic devices that may be integrated with any of the aforementioned integrated circuit, die, chip or package.

FIG. 8 illustrates various electronic devices that may be integrated with any of the aforementioned integrated circuit, die, chip or package. For example, a mobile telephone 802, a laptop computer 804, and a fixed location terminal 806 may include an integrated circuit (IC) 800 having a central thermal management unit. The IC 800 may be, for example, any of the integrated circuits, dice or packages described herein. The devices 802, 804, 806 illustrated in FIG. 8 are merely exemplary. Other electronic devices may also feature the IC 800 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features described herein can be implemented in different systems. It should be noted that the foregoing embodiments are merely examples and are not to be construed as limiting. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus, comprising:
a substrate having a plurality of electrical contact pads;
a molding layer parallel to the substrate, the molding layer having a top surface;
a plurality of solder balls located on the plurality of electrical contact pads, wherein each solder ball of the plurality of solder balls is located on a corresponding one of the plurality of electrical contact pads, wherein each solder ball is at least partially uncovered by a corresponding through mold via of a plurality of through mold vias formed in the molding layer, wherein the plurality of through mold vias are arranged in multiple rows, wherein each of the solder balls in the plurality of solder balls has a vertical diameter and a horizontal diameter, wherein the top surface of the molding layer is coplanar with a top of each of the solder balls and wherein a diameter of each of the through mold vias is less than the horizontal diameter of each of the solder balls; and a plurality of gutters located on an outer portion of, and adjacent to, at least some of the plurality of through mold vias where each gutter in the plurality of gutters extends vertically from the top surface of the molding layer into the molding layer to a depth equal to or less than half the vertical diameter of a corresponding solder ball to accommodate at least some of an adjacent solder ball upon melting.

2. The apparatus of claim 1, wherein the multiple rows in the plurality of through mold vias comprise:

an outer row of through mold vias extending around a perimeter of the apparatus; and an inner row of through mold vias adjacent to the outer row of through mold vias and extending around the perimeter of the apparatus.

3. The apparatus of claim 2, wherein each through mold via in the outer row of through mold vias has a first outer side facing the perimeter of the apparatus and a first inner side facing a center of the apparatus, and wherein each through mold via in the inner row of through mold vias has second outer side facing the center of the apparatus and a second inner side facing the perimeter of the apparatus.

4. The apparatus of claim 1, wherein the each gutter in the plurality of gutters is separate from each other and wherein the plurality of gutters includes at least one pair of gutters corresponding to at least one pair of adjacent solder balls.

5. The apparatus of claim 1, wherein the horizontal length of the each gutter in the plurality of gutters is approximately the length of the horizontal diameter of the corresponding solder ball.

6. The apparatus of claim 1, wherein the each of the solder balls in the plurality of solder balls is co-planar with the top surface of the molding layer.

7. The apparatus of claim 1, wherein a portion of the molding layer is removed to create the each gutter in the plurality of gutters.

8. The apparatus of claim 7, wherein the removed portion is large enough to accommodate approximately 50% of the corresponding solder ball when melting.

9. The apparatus of claim 7, wherein the removed portion is large enough to accommodate between 40% and 50% of the corresponding solder ball when melting.

10. The apparatus of claim 1, wherein the plurality of gutters provide a pressure relief path for the corresponding solder ball when melting.

11. The apparatus of claim 1, incorporated into at least one of a music player, a video player, an entertainment unit, a navigation device, a communications device, a personal digital assistant (PDA), a fixed location data unit, and a computer.

12. The apparatus of claim 1, wherein the plurality of solder balls are arranged in an inner row and an outer row on the substrate.

13. The apparatus of claim 12, wherein each gutter corresponding to a solder ball of the inner row is formed only on an inner side of the corresponding solder ball and wherein each gutter corresponding to a solder ball of the outer row is formed only on an outer side of the corresponding solder ball.

14. The apparatus of claim 12, wherein the substrate is rectangular and the inner row and the outer row are both rectangular.

15. The apparatus of claim 12, wherein a gutter corresponding to a solder ball at a corner of the inner row has an L-shape.

16. The apparatus of claim 12, wherein a gutter corresponding to a solder ball of the inner row that is not at a corner of the inner row is straight.

17. The apparatus of claim 12, wherein a gutter corresponding to a solder ball at a corner of the outer row has an L-shape.

18. The apparatus of claim 12, wherein a gutter corresponding to a solder ball at a corner of the outer row is straight.

19. The apparatus of claim 12, wherein a pair of gutters are provided that correspond to a solder ball at a corner of the outer row.

20. The apparatus of claim 19, wherein the pair of gutters that correspond to the solder ball at the corner of the outer row are both straight.

21. The apparatus of claim 12, wherein a gutter corresponding to a solder ball of the outer row that is not at a corner of the outer row is straight.

22. The apparatus of claim 12, wherein the inner row and the outer row are the only two rows.

23. The apparatus of claim 22, wherein the inner row and the outer row are formed along a perimeter of the substrate.

24. The apparatus of claim 1, wherein at least one of the through mold vias is circular and wherein a corresponding adjacent gutter is rectangular.

25. The apparatus of claim 24, wherein the corresponding adjacent gutter has a length that is no greater than an outer diameter of the through mold via with which it is adjacent.

26. The apparatus of claim 7, wherein the removed portion is sized to accommodate no more than 50% of the corresponding solder ball when melting.

27. The apparatus of claim 7, wherein the removed portion is sized to accommodate between 50% and 60% of the corresponding solder ball when melting.

28. The apparatus of claim 7, wherein the removed portion is sized to accommodate between 30% and 40% of the corresponding solder ball when melting.

29. The apparatus of claim 7, wherein the removed portion is sized to accommodate between 25% and 30% of the corresponding solder ball when melting.

30. The apparatus of claim 7, wherein the removed portion is sized to accommodate at least 10% of the corresponding solder ball when melting.

31. The apparatus of claim 1, wherein the apparatus is Molded Laser Package (MLP).

32. A method for forming the apparatus of claim 1.

* * * * *